United States Patent
Mertens et al.

(10) Patent No.: US 7,532,310 B2
(45) Date of Patent: May 12, 2009

(54) APPARATUS, METHOD FOR SUPPORTING AND/OR THERMALLY CONDITIONING A SUBSTRATE, A SUPPORT TABLE, AND A CHUCK

(75) Inventors: Jeroen Johannes Sophia Maria Mertens, Duizel (NL); Aschwin Lodewijk Hendricus Johannes Van Meer, Roosendaal (NL); Joost Jeroen Ottens, Veldhoven (NL); Edwin Van Gompel, Valkenswaard (NL)

(73) Assignee: ASML Netherlands B.V., Veldhoven (NL)

(*) Notice: Subject to any disclaimer, the term of this patent is extended or adjusted under 35 U.S.C. 154(b) by 560 days.

(21) Appl. No.: 10/970,658

(22) Filed: Oct. 22, 2004

(65) Prior Publication Data
US 2006/0102849 A1 May 18, 2006

(51) Int. Cl.
*G03B 27/58* (2006.01)
*G03B 27/62* (2006.01)

(52) U.S. Cl. .......................... 355/72; 355/75
(58) Field of Classification Search ................. 355/30, 355/53, 72, 75; 361/234; 250/440.11; 269/21
See application file for complete search history.

(56) References Cited

U.S. PATENT DOCUMENTS

| | | | | |
|---|---|---|---|---|
| 5,730,803 A * | 3/1998 | Steger et al. | ............ | 118/723 R |
| 5,738,165 A * | 4/1998 | Imai | .......................... | 165/80.2 |
| 5,777,838 A * | 7/1998 | Tamagawa et al. | .......... | 361/234 |
| 6,320,736 B1 | 11/2001 | Shamouilian et al. | ....... | 361/234 |
| 6,518,548 B2 * | 2/2003 | Sugaya et al. | ............ | 219/444.1 |
| 2001/0003298 A1 * | 6/2001 | Shamouilian et al. | ........ | 156/345 |
| 2002/0008864 A1 * | 1/2002 | Kondo | .......................... | 355/72 |
| 2002/0036373 A1 * | 3/2002 | Kosakai | ....................... | 269/21 |
| 2002/0075624 A1 * | 6/2002 | Wang et al. | ................... | 361/234 |
| 2002/0075625 A1 * | 6/2002 | Sexton et al. | ................ | 361/234 |
| 2002/0159217 A1 * | 10/2002 | Tsuruta et al. | .............. | 361/234 |
| 2003/0001103 A1 * | 1/2003 | Kobayashi et al. | ..... | 250/440.11 |
| 2003/0127605 A1 * | 7/2003 | Kondo | ..................... | 250/492.2 |
| 2004/0099635 A1 * | 5/2004 | Nishikawa | ..................... | 216/58 |
| 2004/0200226 A1 * | 10/2004 | Hara | ............................ | 62/3.2 |

FOREIGN PATENT DOCUMENTS

| JP | 07-142555 A | 6/1995 |
|---|---|---|
| JP | 08-051143 A | 2/1996 |
| JP | 2003-332411 A | 11/2003 |

OTHER PUBLICATIONS

European Search Report issued for European Patent Application No. 05077376.1-2222, dated Mar. 21, 2006.
English Translation of Notice of Reasons for Rejection for Japanese Patent Application No. 2005-306586 dated Sep. 24, 2008.

* cited by examiner

*Primary Examiner*—Peter B Kim
(74) *Attorney, Agent, or Firm*—Pillsbury Winthrop Shaw Pittman LLP (57) ABSTRACT

An apparatus includes a support table for supporting a substrate. The support table includes a plurality of support protrusions that contact the substrate during use for supporting the substrate. The support table includes a plurality of heat transfer protrusions that extend towards the substrate during use without contacting the substrate when the substrate is supported by the support protrusions. Gas-containing heat exchanging gaps for exchanging heat with the substrate extend between the heat transfer protrusions and the substrate.

35 Claims, 5 Drawing Sheets

APPARATUS, METHOD FOR SUPPORTING AND/OR THERMALLY CONDITIONING A SUBSTRATE, A SUPPORT TABLE, AND A CHUCK

FIELD

The invention relates to an apparatus, a method for supporting and/or thermally conditioning a substrate. The invention also relates to a substrate support table, a chuck, a device manufacturing method, and a device manufactured thereby.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It is known to support the substrate using a substrate support table and/or a vacuum chuck. The known substrate table includes protrusions, for example, nipples or the-like, which support the substrate during use. Preferably, the protrusions are relatively small and/or sharp, so that build up of contamination or dust between the support table and substrate may be prevented. In that case, the substrate may be positioned accurately onto the support table, which is desired for a precise transfer of the pattern onto the substrate during lithography.

For example, EP 0947884 discloses a substrate holder, including a plate having a face which is provided with a matrix arrangement of protrusions for supporting a substrate. The face is also provided with a distributed plurality of apertures extending through the plate. By connecting the apertures in the plate to vacuum generator, the backside of the substrate may be sucked securely against the protrusions.

U.S. Pat. No. 6,257,564 B1 discloses a vacuum chuck, having nipples as support structure. Two types of nipples are used: plain nipples that provide only support, and vacuum nipples that provide support and deliver vacuum to retain the wafer on the chuck. The nipples reduce the contact area between the wafer and the chuck so that contamination of the wafer may be reduced. According to U.S. Pat. No. 6,257,564 B1, warpage of relatively large 300 mm wafers may be avoided.

U.S. Pat. No. 6,664,549 B2 discloses another embodiment of a vacuum chuck, wherein a rear surface of a wafer is held on support pins by suction with a suction chamber.

During use, for example, during the imaging in a lithography method, the substrate may heat up. On the other hand, in case the substrate has been wetted by liquid, for example, when immersion lithography is applied, heat may removed from the substrate via evaporation of the liquid. Such heat flows lead to thermal expansion and/or contraction of the substrate, which may hamper a desired accurate positioning of the substrate. For example, thermal fluctuations of the substrate may cause overlay errors, when the substrate is being subjected to a lithographic process.

SUMMARY

It is an aspect of the present invention to improve the known apparatus and method.

It is an aspect of the present invention to provide an apparatus and method in which a substrate may be positioned accurately for a desired period of time, particularly when heat is being transferred to and/or from the substrate.

An aspect of the invention is to provide a way for positioning a substrate accurately in which the temperature of the substrate may be conditioned relatively well.

An aspect of the invention is to improve a lithographic apparatus and a lithographic device manufacturing method in which overlay errors may be reduced.

According to an embodiment of the invention, there is provided an apparatus, for example, a lithographic apparatus or a part thereof, that includes a support table for supporting a substrate. The support table includes a plurality of support protrusions that contact the substrate during use for supporting the substrate. The support table includes a plurality of heat transfer protrusions that extend towards the substrate without contacting the substrate when the substrate is supported by the support protrusions. Gas-containing heat exchanging gaps for exchanging heat with the substrate extend between the heat transfer protrusions and the substrate.

According to an embodiment of the invention, there is provided an apparatus that includes a chuck for supporting a substrate support table. The support table includes a plurality of heat transfer protrusions extending towards the chuck without contacting the chuck such that gas-containing heat exchanging gaps for exchanging heat with the chuck extend between the heat transfer protrusions and the chuck.

The present invention further provides an apparatus, for example, a lithographic apparatus or part thereof, that includes a support table for supporting a substrate. The support table includes a supporting side having a plurality of support protrusions and a plurality of heat transfer protrusions. The height of the support protrusions is slightly larger than the height of the heat transfer protrusions.

In an embodiment of the invention, an apparatus, for example, a lithographic apparatus or part thereof, includes a chuck for supporting a support table. The support table and/or the chuck includes a plurality of support protrusions that extend between the support table and the chuck such that the support table and the chuck enclose a second space. The chuck includes a plurality of heat transfer protrusions extending towards the chuck without contacting the chuck, such that gas-containing heat exchanging gaps for exchanging heat with the chuck extend between the heat transfer protrusions and the chuck.

The invention further provides the use of such an apparatus.

The invention also provides a method for supporting and/or thermally conditioning a substrate, utilizing such an apparatus.

According to an embodiment of the invention, a method for thermally conditioning a substrate is provided. A support table is provided and includes a plurality of support protrusions that contact the substrate for supporting the substrate.

The support table also includes a plurality of heat transfer protrusions that extend towards the substrate without contacting the substrate. Heat is transferred from the substrate to the heat transfer protrusions and/or vice versa via gas conduction by utilizing gas that is located in heat exchanging gaps extending between the heat transfer protrusions and the substrate.

According to an embodiment of the invention, a method for thermally conditioning a substrate that is supported by a support table is provided. The support table includes a plurality of support protrusions for supporting the substrate, and a plurality of heat transfer protrusions that extend towards the substrate without contacting the substrate when the substrate is supported by the support protrusions. The method includes providing gas in heat exchanging gaps extending between the heat transfer protrusions and the substrate, and transferring heat from the substrate to the heat transfer protrusions and/or vice-versa via the gas.

In another embodiment of the invention, a method for thermally conditioning a substrate support table is provided. The support table is supported by a plurality of supporting protrusions extending between the support table and a chuck. The method includes thermally coupling the support table to the chuck with heat transfer protrusions that provide small gas-containing heat exchanging gaps between the support table and the chuck.

The present invention also provides a device manufactured using the apparatus, as well as a device manufactured utilizing a device manufacturing method.

In another embodiment of the invention, there is provided the use of a plurality of support protrusions for supporting a lower side of a wafer by mechanical contact. Heat transfer protrusions are used for heat transfer to and/or from the wafer, utilizing heat transfer by gas conduction, without the heat transfer protrusions contacting the wafer.

Another embodiment of the invention provides a device manufacturing method. The method includes transferring a pattern from a patterning device onto a substrate that is supported by a support table. The support table includes a plurality of support protrusions for supporting the substrate, and a plurality of heat transfer protrusions extending towards the substrate without contacting the substrate when the substrate is supported by the support protrusions. The method also includes providing gas to heat exchanging gaps extending between the heat transfer protrusions and the substrate, and transferring heat from the substrate to the heat transfer protrusions and/or vice-versa via the gas.

In another embodiment, a lithographic apparatus is provided. The apparatus includes an illumination system for conditioning a beam of radiation, and a support for supporting a patterning device. The patterning device is configured to pattern the beam of radiation. The apparatus also includes a support table for supporting a substrate, and a projection system for projecting the patterned beam of radiation onto a target portion of the substrate. The support table includes a plurality of support protrusions for supporting the substrate, and a plurality of heat transfer protrusions that extend towards the substrate without contacting the substrate when the substrate is supported by the support protrusions. Gas-containing heat exchanging gaps for exchanging heat with the substrate extend between the heat transfer protrusions and the substrate.

According to another embodiment of the invention, a support table for supporting a substrate in a lithographic apparatus is provided. The support table includes a plurality of support protrusions for supporting the substrate, and a plurality of heat transfer protrusions that extend towards the substrate without contacting the substrate when the substrate is supported by the support protrusions. Gas-containing heat exchanging gaps for exchanging heat with the substrate extend between the heat transfer protrusions and the substrate.

In another embodiment, a support table for supporting a substrate in a lithographic apparatus is provided. The support table includes a supporting side having a plurality of support protrusions and a plurality of heat transfer protrusions. The height of the support protrusions is slightly greater than the height of the heat transfer protrusions.

Also, the present invention provides the use of a plurality of support protrusions for supporting a lower side of a wafer support by mechanical contact. The heat transfer protrusions are used for heat transfer to and/or from the wafer support, utilizing heat transfer by gas conduction, without the heat transfer protrusions contacting the wafer support.

The invention provides the use of a plurality of support protrusions for holding a lower side of a wafer support spaced apart from an opposite chuck surface. Heat transfer protrusions are used for heat transfer to and/or from the wafer support, utilizing heat transfer by gas conduction, without the heat transfer protrusions contacting the chuck.

In further embodiments of the invention, there are provided a substrate support table of an apparatus as described herein, and a chuck of an apparatus as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
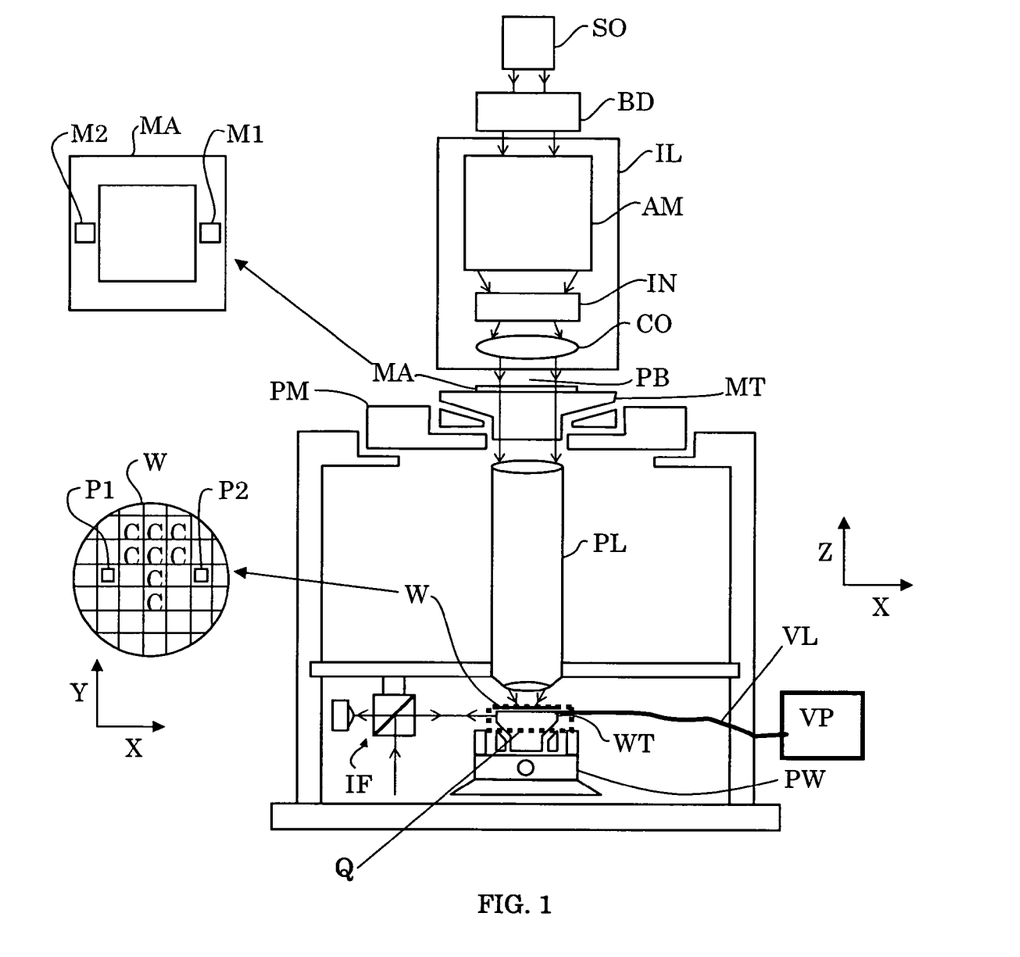
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as s-outer and s-inner, respectively) of the intensity distribution in a pupil plane of the illuminator may be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT may be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
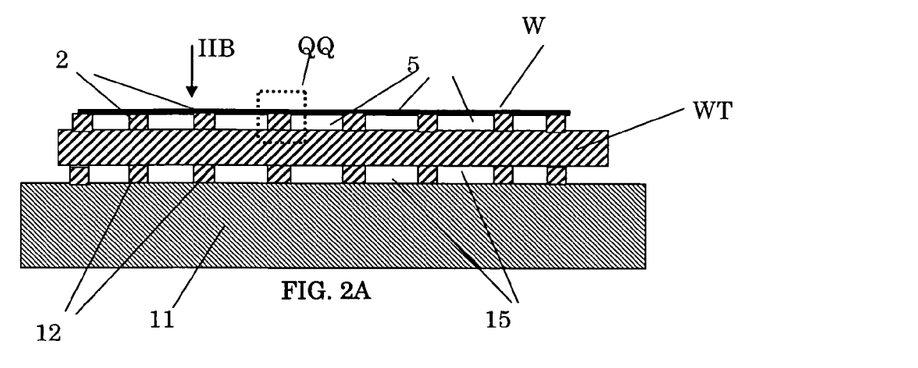
FIG. 2A schematically shows a detail Q of FIG. 1, showing a support structure having known support protrusions.
Figure 2B:
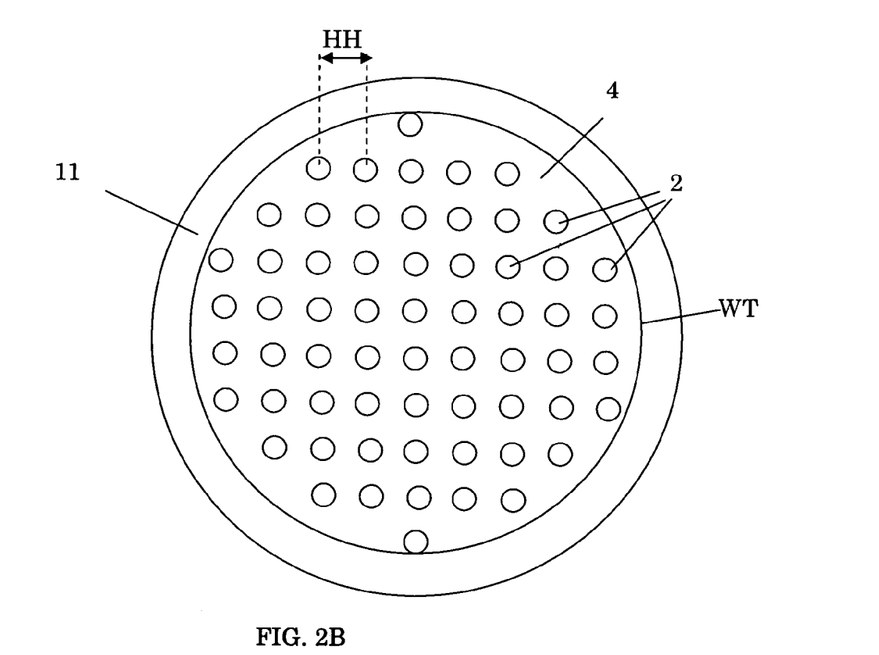
FIG. 2B schematically shows a top view of FIG. 2A, in a direction of arrow 1113, wherein the substrate is not shown.
Figure 3:
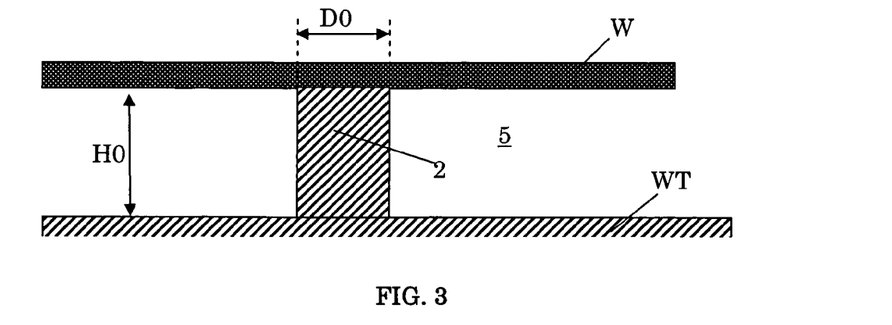
FIG. 3 schematically shows a detail QQ of FIG. 2A, depicting a known support protrusion.
Figure 4:
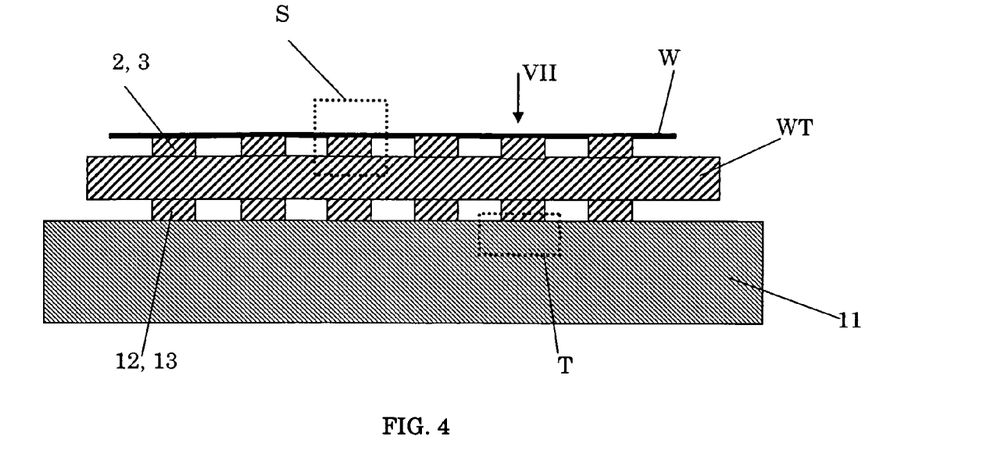
FIG. 4 is a similar detail Q as FIG. 2A, depicting a first embodiment of the present invention.

FIGS. 2-4 shows part of the substrate support structure in more detail. The substrate support structure includes a support table WT and a chuck 11 for supporting the support table WT. A support side of the support table WT, which is faced towards the substrate W during use, integrally includes a plurality of support protrusions 2. These protrusions 2 contact a surface of the substrate W mechanically during use. Preferably, the support protrusions 2 are substantially evenly distributed over the upper side of the support table WT, for supporting the substrate W evenly. An example of such an even distribution is shown in FIG. 2B.

The support table WT and the support protrusions 2 enclose a first space 5 with the substrate W. The apparatus further includes at least one pump VP for pumping one or more gasses from and/or into the first space 5. The gas or gasses may include, for example, at least one of the following gasses or gas mixtures: air, helium, argon, nitrogen or the-like.

The pump VP has been depicted schematically in FIG. 1. In the present embodiment, the pump VP is arranged to apply an underpressure, or vacuum, to the first space 5 for clamping the substrate W onto the support protrusions 2 of the support table WT. Then, one or more gasses, surrounding the substrate support structure, may flow or leak into the first space 5 during use, to be pumped away by the pump VP. When no such underpressure is applied to the first space 5, the clamping of the substrate W to the support table is undone so that the substrate W may be removed from the table WT.

To the skilled person, it will be clear how to arrange the at least one pump VP, and how to couple such pump to the first space 5, for example, with one or more suitable vacuum lines VL. The pump VP may include, for example, a vacuum pump and/or the-like.

The support protrusions 2 may have various forms and dimensions. The protrusions 2 may be nipples or the-like protruding parts. In the embodiment of FIGS. 2 and 3, the support protrusions 2 are substantially cylindrical, having substantially flat supporting surfaces for supporting the substrate. The height H0 of the support protrusions is, for example, in the range of about 0.1-0.2 mm, measured in a direction perpendicular to the support surface of the support table WT. The diameters D0 of the support protrusions are preferably relatively small, for example in the range of about 0.05-1.0 mm, particularly about 0.15 mm. The center axes of neighboring support protrusions 2 may be spaced apart, for example by a distance HH in the range of about 1-10 mm, for example, about 2.5 mm. Naturally, other diameters and dimensions may be applied, if desired.

A back side of the support table WT, which surface is faced away from the support side and towards the chuck 11, also integrally includes a number of cylindrical support protrusions 12. The support protrusions 2, 12 of the opposite sides of the support table WT are axially aligned with respect to each other. A second space 15, which is being enclosed by the support table WT and the chuck 11, is preferably also connected to the one or more pumps VP, for example, for applying an underpressure in the second space 15 to clamp the support table WT to the chuck 11.

The support structure of FIGS. 2 and 3 may provide an arrangement in which the substrate W may be held firmly during use, for example, by applying suitable vacuum pressures in the first space 5 and second space 15. Also, contamination of the chuck 11, support table WT and substrate W may be prevented or reduced by continuously feeding gas flows into and out of the first and second space during use. However, a disadvantage of the structure shown in FIGS. 2 and 3 may be that the thermal contact between the substrate W and the substrate table WT is relatively poor. The same holds for the thermal contact between the substrate table WT and the chuck 11. Thus, the substrate W is relatively thermally isolated from the substrate table WT and chuck 11. This may lead to relatively large temperature variations of the substrate W, when heat flows are applied to the substrate W. For example, the substrate W could heat up relatively fast under influence of absorption of heat from a beam of radiation which is being projected on the substrate W. On the other hand, in case the substrate W is wet, such as in immersion lithography, the substrate W may cool down relatively fast when liquid evaporates there-from during use.

FIGS. 4-7 show a first embodiment according to the present invention, in which the substrate W may be thermally conditioned relatively well.

As is shown in FIGS. 4-7, in the first embodiment 1, the support table WT not only includes a plurality of support protrusions 2 which contact the substrate W, but also a plurality of first heat transfer protrusions 3 extending towards the substrate W during use without contacting the substrate W. Therefore, heat exchanging gaps 6 for exchanging heat with the substrate W extend between the heat transfer protrusions and the substrate W. In the present embodiment, the heat exchanging gaps 6 are part of the first space 5.

Figure 5:
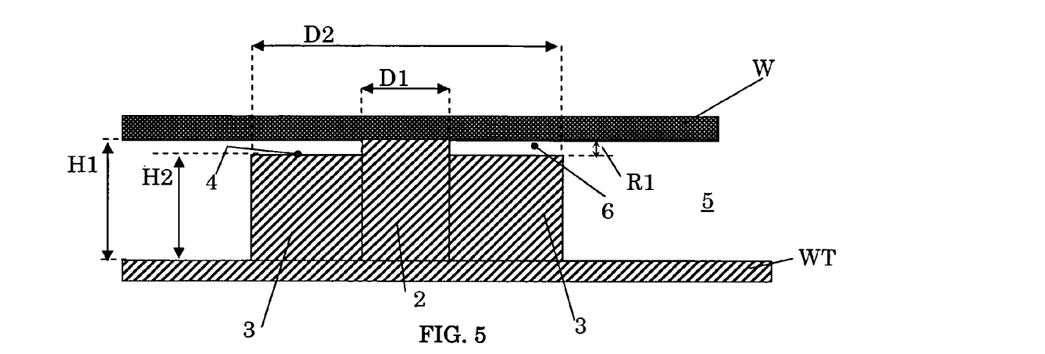
FIG. 5 shows a detail S of FIG. 4.

Each first heat transfer protrusion 3 includes a heat exchanging surface 4 which extends substantially parallel to, and faced towards the substrate W during use. The first heat transfer protrusions 3 are cylindrical, and arranged concentrically around respective support protrusions 2. Each heat exchanging surface 4 is a substantially ring shaped surface.

Also, each first heat transfer protrusion 3 is located next to a support protrusions 2. Moreover, in the present embodiment, all first heat transfer protrusions 3 are integral parts support protrusions 2.

The heat exchanging gaps are relatively small compared to the height of the protrusions. To this aim, the support protrusions have a first height H1, measured in a direction perpendicular to the substrate W, wherein the first heat transfer protrusions 3 have a second height H2 which is slightly smaller than the first height H1.

According to an aspect of the invention, the height H1 of the support protrusions 2 as such is, for example, larger than about 0.2 mm, for example, a height H1 in the range of about 0.2-1.0 mm. The diameters D1 of the support protrusions are again preferably relatively small, for example in the range of about 0.05-1.0 mm, particularly about 0.15 mm. The center axes of neighboring support protrusions 1 may be spaced apart, for example by a distance HH in the range of about 1-10 mm, for example about 2.5 mm. The outer diameter D2 of each heat transfer protrusions 3 is, for example, in the range of about 1-10 mm, depending on the distance HH between the center axes of the protrusions. By choosing appropriate dimensions of the protrusions 2, 3, sufficient intermediate space 5 may be provided for achieving desired gas flows between the substrate W and the substrate table WT during use. Such gas flows may be used for providing a suitable clamping pressure between the substrate W and the substrate table WT and/or for removing contamination therefrom. Good results may be obtained, when the outer diameter D2 of each heat transfer protrusions 3 is in the range of about 1-2 mm. Good results may be obtained, when the height H1 of the support protrusions 2 as such is in the range of about 0.3-0.5 mm, for example a height of about 0.4 mm. The distance X1 between the outer contours of neighboring first heat transfer protrusions may be relatively small, for example, in the range of about 0.5-1 mm. Also, other suitable values may be chosen for the last-mentioned distance X1, if desired.

Furthermore, preferably, the heat transfer protrusions 3 are arranged such that the total heat exchanging surface area, which consists of all heat exchanging surfaces 4 of these protrusions, is relatively large. For example, the total heat exchanging surface area is at least about 50% or more, preferably about 60%, of an overall surface area of the part of the substrate table WT that is faced towards the substrate W during use.

In a further embodiment of the invention, each heat exchanging gap 6 has a thickness R1 of about 10 μm or less. This thickness R1 equals the difference between the above-mentioned heights H1, H2 of the first heat transfer protrusions 3 and the first support protrusions 2. Also, good results may be obtained when the thickness R1 of each heat exchanging gap 6 is in the range of about 1-5 μm, for example about 3 μm. Other dimensions may also be applied, for example, a thickness R1 below 1 μm. However, a thickness R1 that is below 1 μm may make the support structure more sensitive to contaminating particles, such as dust.

During use, one or more gasses or gas mixtures may be located in the first space 5, and therefore in the heat exchanging gaps 6 as well. Then, heat exchange by gas conduction may take place via the heat exchanging gaps 6 during use. Particularly, when the heat exchanging 6 gaps are relatively small, for example, having a thickness R1 of about 10 μm or less, relatively high gas pressures may still be used in the first space 5, while thermal gas conduction is available through the heat exchange gaps 6. A relatively large ratio of the surface of the substrate table WT, which ratio consists of the heat exchanging surfaces 4, extends at close distance from the substrate W. In that case, relatively large amounts of heat may be transferred by the gas via the heat exchanging gaps 6. Consequently, the thermal contact between the substrate W and the substrate table WT may be significantly improved. Therefore, the substrate table WT may provide an extra thermal mass to the substrate W, which delays temperature variations of the substrate W caused by the above-mentioned heat flows.

Moreover, as is shown in FIGS. 4-7, the back side of the support table WT of the first embodiment also includes a large number of second heat transfer protrusions 13 that extend towards the chuck 11 without mechanically contacting the chuck 11. The last-mentioned second heat transfer protrusions serve to exchanging heat with the chuck 11 using gas conduction, similar to functioning of the above-describe first heat transfer protrusions 3 with respect to the substrate W. Preferably, the second heat transfer protrusions 13 are arranged such that a respective total heat exchanging surface area which consists of all heat exchanging surfaces 14 of these protrusions 13, is relatively large. For example, the last-mentioned total heat exchanging surface area is at least about 50% or more, preferably about 60%, of an overall surface area of the part of the substrate table WT that is faced towards the chuck 11 during use.

Figure 6:
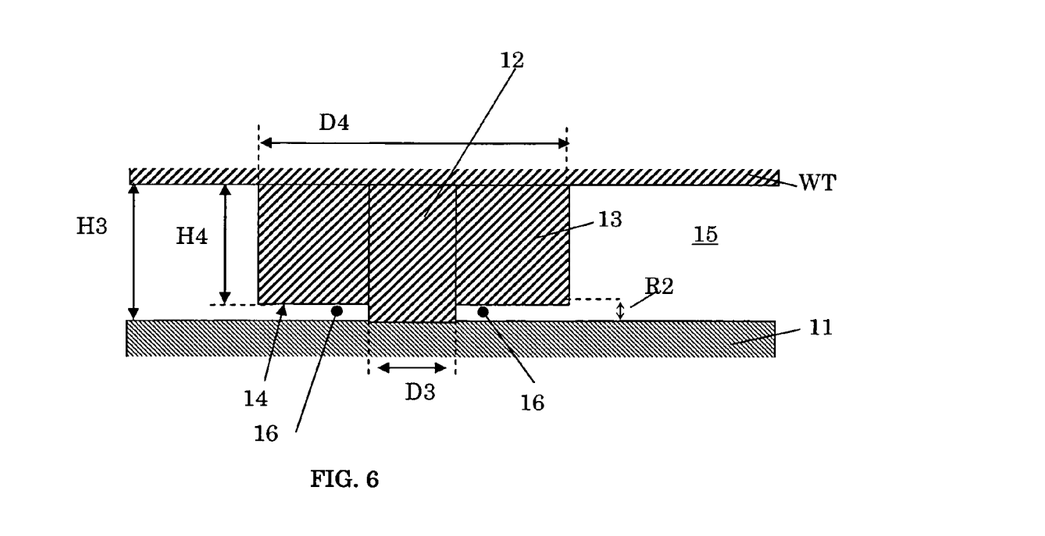
FIG. 6 shows a detail T of FIG. 4.
Figure 7:
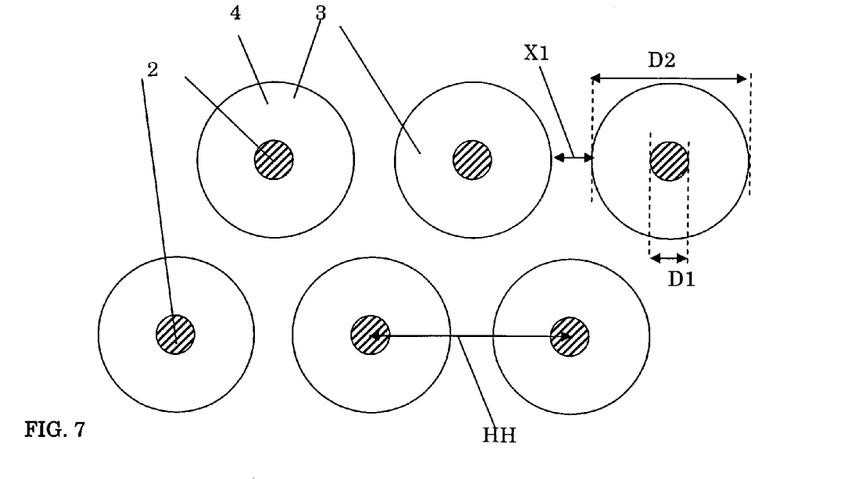
FIG. 7 shows top view, in a direction of arrow VII-VII of FIG. 4, without the substrate.

The second heat transfer protrusions 13 are axially aligned with respect to the first heat transfer protrusions 3. Also, each second heat transfer protrusion 13 may include a ring shaped heat exchanging surface 14 that extends substantially parallel to, and faced towards an opposite surface of the chuck 11 during use.

Further, the support protrusions extending between the support table WT and the chuck 11, have a height H3, measured in a direction perpendicular to the substrate table WT. The height H3 is slightly larger than the height H4 of the second heat transfer protrusions 13. In the present embodiment, all second heat transfer protrusions 3 are integral parts of respective support protrusions 2. As has been shown in FIG. 6, the second support protrusions have outer diameters D3, whereas the second heat transfer protrusions have outer diameters D4.

The dimensions H3, D3 of the second support protrusions 13 of the first embodiment may be, for example, the same as or different from the dimensions H1, D1 of the first support protrusions 3. Also, the dimensions H4, D4 of the second heat transfer protrusions 14 of the first embodiment may be, for example, the same as or different from the dimensions H2, D2 of the first heat transfer protrusions 14. Examples of such dimensions, particularly heights and diameters of the protrusions, are mentioned above.

For example, each heat exchanging gap 16, extending between a heat transfer protrusion and the chuck 11, may have a thickness R2 of about 10 μm or less. This thickness R2 equals the difference between the above-mentioned heights of the second heat transfer protrusions 13 and the second support protrusions 12. This thickness R2 may be, for example, in the range of about 1-5 μm, for example, about 3 μm. Using such thicknesses, and depending on the gas pressure in the second space 15 during use, good thermal conditioning results may be obtained with regard to heat transfer between the support table WT and the chuck 11. In that case, the chuck 11 may also form a thermal mass, which is coupled to the substrate W via the support table WT. Then, the chuck 11 may also aid in thermally conditioning the substrate W during use. Particularly, the chuck 11 provides an extra thermal mass to the substrate table WT, as well as to the substrate W, which delays temperature variations of both the substrate table WT and the substrate W caused by the above-mentioned heat flows.

By using the first embodiment in of a lithographic device manufacturing method, substrates may be held relatively firmly, relatively free from contamination, and positioned relatively accurately. The device manufacturing method may include or involve various methods, for example, a method as described above and/or below. The device manufacturing method may include, for example, transferring a pattern from a patterning device onto a substrate, for example, a lithographic device manufacturing method. The method may include, for example, at least projecting a patterned beam of radiation onto a substrate. In the last-mentioned method, an apparatus as depicted in FIG. 1 may be used, for example.

Then, during use, the substrate W may be held by the support table WT using an underpressure of gas or gasses in the first space 5. Also, the support table WT may be held by the chuck 11 utilizing an underpressure in the second space 15.

The accurate positioning of the substrates may be further improved by the relatively long-lasting thermal conditioning of the substrates. The improved thermal conditioning may be a result of the improved coupling of the thermal masses of the substrate table WT and chuck 11 to each other and to the substrates. Particularly, the thermal coupling may be improved by the application of the heat transfer protrusions 3, 13. The first heat transfer protrusions 3 may simply be used for heat transfer to and/or from the wafer, utilizing heat transfer by gas conduction, without the heat transfer protrusions contacting the wafer. The second heat transfer protrusions 13 may simply be used for heat transfer to and/or from the wafer support WT, utilizing heat transfer by gas conduction, without the heat transfer protrusions contacting the chuck 11. Because the heat transfer surfaces 4, 14 of the heat transfer protrusions 3, 13 extend substantially parallel to the opposite surface of the substrate W or chuck 11 respectively, relatively good thermal contact may be achieved.

Because of the improved thermal conditioning of the substrate, the device manufacturing method may be carried out with reduced overlay errors and/or improved focussing, which may lead to improved devices manufactured thereby.

Following from FIGS. 4 and 6, the present invention also provides a method for thermally conditioning a substrate support table. The support table WT is being supported by a number of supporting protrusions extending between the support table WT and a chuck 11, and the support table is thermally coupled to the chuck 11 by heat transfer protrusions which provide small gas-containing heat exchanging gaps 16 between the support table WT and the chuck 11.

Figure 8:
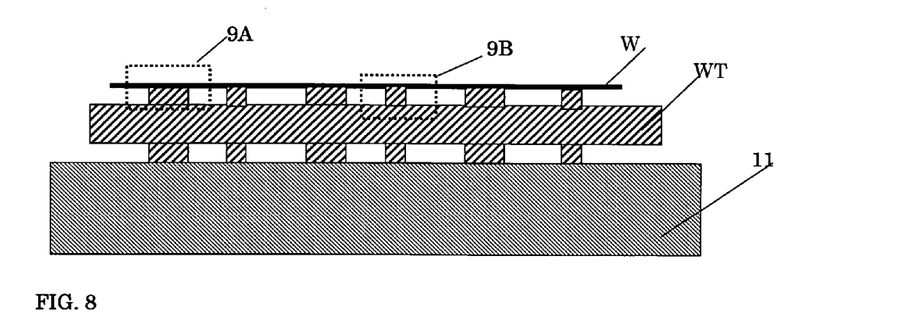
FIG. 8 shows a similar detail Q as FIG. 2A of a second embodiment of the invention.
Figure 9A:
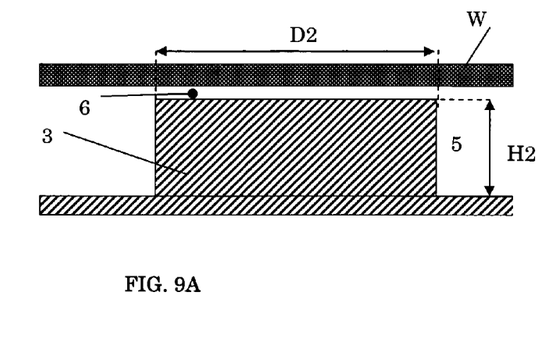
FIG. 9A shows a detail 9A of FIG. 8.
Figure 9B:
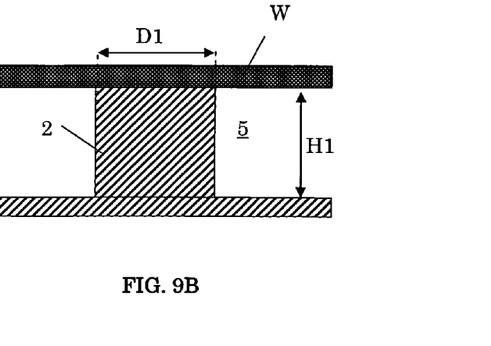
FIG. 9B shows a detail 9B of FIG. 8.

FIGS. 8 and 9 shows a second embodiment of the present invention. The second embodiment functions substantially the same as the above-described first embodiment. As is clearly visible in FIGS. 8 and 9, the substrate table WT of the second embodiment also includes first and second support protrusions 2, 12 and first and second heat transfer protrusions 3, 13. Again, a first space 5 extends between the substrate and the substrate table WT, whereas a second space 15 extends between the chuck 11 and the substrate table WT. In the second embodiment, however, the heat transfer protrusions 3, 13 are spatially separated from the respective support protrusions, as shown in FIGS. 9A and 9B. In the second embodiment, the protrusions extending from the support side of the support table WT and the protrusions extending from the backside of the support table WT are, again, aligned with respect to each other. Also in this case, the heat transfer protrusions 3 may be arranged such that the total heat exchanging surface area, which includes all heat exchanging surfaces 4 of these protrusions, is relatively large, as explained above.

Figure 10:
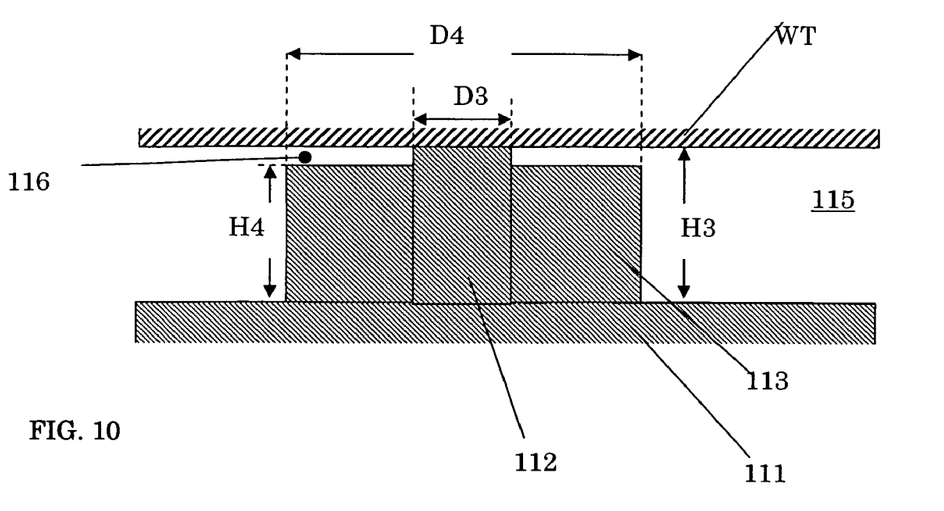
FIG. 10 schematically shows a third embodiment of the invention.

FIG. 10 shows part of a chuck 111 and substrate table WT according to a third embodiment of the invention. In the third embodiment, the chuck 111 integrally includes a plurality of support protrusions 112 that extend between the support table WT and the chuck 111 such that the support table WT and the chuck 111 enclose at least one second space 15. During use, the support protrusions 112 support a lower side of the substrate support WT by mechanical contact. Alternatively, the support table WT may include such support protrusions, as in the first and second embodiment.

In the third embodiment, the chuck 111 includes a number of second heat transfer protrusions 113 that extend towards the support table without contacting the support table WT, such that gas-containing heat exchanging gaps 116 for exchanging heat with the support table extend between the heat transfer protrusions and the support table. For example, each of the heat exchanging gap 116 may have a thickness R2' of about 10 μm or less. Also, the thickness R2' of each the heat exchanging gap 116 may be, for example, in the range of about 1-5 μm, for example, about 3 μm. In the third embodiment, the second heat transfer protrusions 113 of the chuck 111 may be arranged such that the total heat exchanging surface area, which includes all heat exchanging surfaces of these protrusions, is relatively large. For example, the total heat exchanging surface area is at least about 50% or more, preferably about 60%, of an overall surface area of the part of the chuck 111 that is faced towards the substrate table WT during use.

The functioning of the third embodiment is substantially similar to the workings of the first and/or second embodiment. In the third embodiment, however, second heat exchanging gaps 16' extend near the substrate support WT instead of near the chuck 11. These second heat exchanging gaps are preferably sufficiently small, with respect to the pressure of gas in the second space 15', for allowing heat transfer between the second heat exchanging protrusions 13' and the support table WT by gas conduction. Because the total heat exchanging surface area of the second heat exchanging protrusions is relatively large, large amounts of heat may be transferred during use.

Naturally, combinations of the above-described embodiments also fall within the scope of the present invention, as claimed in the accompanying claims.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In the following example, calculations were performed on the embodiment shown in FIG. 3, compared to the embodiment of FIG. 5. The calculations specifically were made to obtain the heat transfer from the center of a silicon wafer substrate W to the center of the support table WT. In these calculations, the support table and the protrusions 2, 3 thereof were made of ZERODUR®, a glass ceramic material manufactured by Schott AG of Mainz, Germany.

In the embodiment of FIG. 3, the diameter D0 of the support protrusions was chosen to be 0.5 mm. The height H0 of the support protrusions was 0.15 mm. The pitch HH between the center lines of the support protrusions was 2.5 mm. The first space, between the wafer W and support table WT, was filled with air at a pressure of 0.5 bar. From the calculations, it followed that the heat transfer from the wafer center to the middle of the wafer table WT was 160 W/m$^2$K.

Then, similar calculations were performed on the first embodiment according to the invention of FIG. 5. The diameter D1 of the support protrusions 2 was again chosen to be 0.5 mm. The heat transfer protrusions had a diameter D2 of 2 mm. The pitch HH between the center lines of the support protrusions was again 2.5 mm. The height H1 of the support protrusions was, however, 0.4 mm, to provide a sufficient amount of space 5 for gas flow along the wafer W and the wafer table WT. The height H2 of the heat transfer protrusions 3 was 3 μm smaller than the height H1 of the support protrusions, so that the heat transfer gaps were 3 μm in height. The first space, between the wafer W and support table WT, was also filled with air at a pressure of 0.5 bar. From the calculations, it followed that the resulting heat transfer from the wafer center to the middle of the wafer table WT was 650 W/m$^2$K.

From this example, it follows that the application of the heat transfer protrusions may lead to an improvement of heat transfer between, for example, the substrate W and the substrate support table WT, which may provide the above-mentioned advantages.

In the embodiment of FIG. 5, the diameter D0 of the support protrusions was 0.5 mm. The height H0 of the support protrusions was 0.15 mm. The pitch HH between the center lines of the support protrusions was 2.5 mm.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The chuck may be arranged in various ways for holding the substrate and/or the substrate table. For example, the chuck may be a vacuum chuck and/or an electrostatic chuck.

The substrate table and/or the chuck may be provided with a temperature controller, for example, with one or more heaters, fluid cooling circuits and/or the like, for controlling the temperature of the substrate table and/or chuck.

Also, each support protrusion and each heat transfer protrusion may have various shapes and forms. For example, such protrusions may have circular, square, rectangular, triangular, oval and/or other cross-sections.

What is claimed is:

1. An apparatus comprising a support table for supporting a substrate, said support table comprising a plurality of support protrusions for supporting the substrate, and a plurality of heat transfer protrusions extending towards the substrate without contacting the substrate when said substrate is supported by said support protrusions, wherein gas-containing heat exchanging gaps for exchanging heat with the substrate extend between the heat transfer protrusions and the substrate, wherein said support table and said support and heat transfer protrusions, together with the substrate, are arranged to substantially enclose a first space, and wherein said heat exchanging gaps are part of said first space.

2. An apparatus according to claim 1, wherein each heat exchanging gap has a thickness of about 10 μm or less.

3. An apparatus according to claim 1, wherein the thickness of each heat exchanging gap is in the range of about 1-5 μm.

4. An apparatus according to claim 1, wherein each heat transfer protrusion comprises a heat exchanging surface that extends substantially parallel to, and faces towards the substrate that is supported by said support protrusions during use.

5. An apparatus according to claim 4, wherein said heat exchanging surface is a substantially circular or ring-shaped surface.

6. An apparatus according to claim 4, wherein the total heat exchanging surface area, which consists of all said heat exchanging surfaces, is at least about 50% or more of an overall surface area of the part of the substrate table that faces towards the substrate during use.

7. An apparatus according to claim 1, wherein the support protrusions have a first height, measured in a direction perpendicular to the substrate, and the heat transfer protrusions have a second height that is smaller than said first height.

8. An apparatus according to claim 1, wherein a number of said heat transfer protrusions are integral parts of a number of said support protrusions.

9. An apparatus according to claim 1, wherein at least a number of said heat transfer protrusions are separate parts with respect of said support protrusions.

10. An apparatus according to claim 1, wherein said heat transfer protrusions are rotationally symmetrical parts.

11. An apparatus according to claim 1, wherein the apparatus further comprises at least one pump for pumping one or more gasses from and/or into said first space.

12. An apparatus according to claim 11, wherein the support table is arranged to hold a substrate by an underpressure of said first space.

13. An apparatus according to claim 1, further comprising a chuck for supporting said support table.

14. An apparatus according to claim 13, wherein the support table and/or the chuck comprises a plurality of second support protrusions, extending between the support table and the chuck, such that the support table and the chuck enclose a second space.

15. A substrate support table configured to support a substrate, the substrate table comprising: a plurality of support protrusions for supporting the substrate, and a plurality of heat transfer protrusions extending towards the substrate without contacting the substrate when said substrate is supported by said support protrusions, wherein gas-containing heat exchanging gaps for exchanging heat with the substrate extend between the heat transfer protrusions and the substrate, wherein said support table and said support and heat transfer protrusions, together with the substrate, are arranged to substantially enclose a first space, and wherein said heat exchanging gaps are part of said first space.

16. An apparatus comprising a support table for supporting a substrate, said support table comprising a supporting side having a plurality of support protrusions and a plurality of heat transfer protrusions, wherein the height of the support protrusions is slightly greater than the height of the heat transfer protrusions so as to create a heat exchanging gap between the heat transfer protrusions and the substrate when the substrate is supported by the support protrusions, wherein said support table and said support and heat transfer protrusions, together with the substrate, are arranged to substantially enclose a space when the substrate is supported by the support protrusions, and wherein said heat exchanging gaps are part of said space.

17. An apparatus according to claim 16, wherein the height of the support protrusions is greater than about 0.1 mm.

18. An apparatus according to claim 16, wherein the difference in height between the support protrusions and the heat transfer protrusions is less than about 0.01 mm.

19. An apparatus according to claim 16, wherein the difference in height between the support protrusions and the heat transfer protrusions is in the range of about 1-5 $\mu$m.

20. An apparatus according to claim 16, wherein said support protrusions and said heat transfer protrusions are substantially evenly distributed over the supporting side of the support table.

21. An apparatus according to claim 16, wherein the support protrusions and the heat transfer protrusions are substantially cylindrical.

22. An apparatus according to claim 16, wherein the heat transfer protrusions are located next to, or near, or between, or any combination thereof, the support protrusions.

23. An apparatus according to claim 22, wherein each heat transfer protrusion, which extends towards the substrate during use, comprises a heat exchanging surface that extends substantially parallel to, and faced towards an opposite surface of the substrate during use, wherein the total heat exchanging surface area that consists of all said heat exchanging surfaces is at least about 50% or more of an overall surface area of a part of the substrate table that is faced towards the substrate during use.

24. An apparatus according to claim 16, wherein the support table further comprises a back side, which is faced away from said support side, wherein the back side of the support table comprises a plurality of second support protrusions and a plurality of second heat transfer protrusions, wherein the height of the second support protrusions is slightly larger than the height of the second heat transfer protrusions.

25. An apparatus according to claim 24, wherein the protrusions extending from the support side of the support table and the second protrusions extending from the backside of the support table are aligned with respect to each other.

26. An apparatus comprising a support table for supporting a substrate, said support table comprising a supporting side having a plurality of support protrusions and a plurality of heat transfer protrusions, wherein the height of the support protrusions is larger than about 0.2 mm, and the height of the support protrusions is slightly larger than the height of the heat transfer protrusions.

27. An apparatus according to claim 26, wherein the height of the support protrusions larger than the height of the heat transfer protrusions by an amount which is in the range of about 1-5 $\mu$m.

28. An apparatus according to claim 27, wherein the diameter of each support protrusion is in the range of about 0.05-1.0 mm.

29. An apparatus according to claim 27, wherein center axes of neighboring support protrusions are spaced apart by a distance in the range of about 1-10 mm.

30. An apparatus according to claim 27, wherein the diameter of each heat transfer protrusion is in the range of about 1-10 mm.

31. An apparatus according to claim 27, wherein the nearest distance between neighboring heat transfer protrusions is in the range of about 0.5-1 mm.

32. An apparatus according to claim 31, wherein each heat transfer protrusion that extends towards the substrate during use, comprises a heat exchanging surface that extends substantially parallel to, and is faced towards an opposite surface of the substrate during use, wherein the total heat exchanging surface area, which consists of all said heat exchanging surfaces, is about 50% or more of an overall surface area of a part of the substrate table that is faced towards the substrate during use.

33. A lithographic apparatus comprising:
   an illumination system for conditioning a beam of radiation;
   a support for supporting a patterning device, the patterning device being configured to pattern the beam of radiation;
   a support table for supporting a substrate; and
   a projection system for projecting the patterned beam of radiation onto a target portion of the substrate,
   wherein the support table comprises a plurality of support protrusions for supporting the substrate, and a plurality of heat transfer protrusions extending towards the substrate without contacting the substrate when the substrate is supported by the support protrusions, wherein gas-containing heat exchanging gaps for exchanging heat with the substrate extend between the heat transfer protrusions and the substrate, wherein said support table and said support and heat transfer protrusions, together with the substrate, are arranged to substantially enclose a space, and wherein said heat exchanging gaps are part of said space.

34. A support table for supporting a substrate in a lithographic apparatus, said support table comprising:
   a plurality of support protrusions for supporting the substrate; and
   a plurality of heat transfer protrusions extending towards the substrate without contacting the substrate when said substrate is supported by said support protrusions,
   wherein gas-containing heat exchanging gaps for exchanging heat with the substrate extend between the heat transfer protrusions and the substrate and are part of a space substantially enclosed by said support table, said support and heat transfer protrusions, and the substrate when the substrate is supported by said support protrusions.

35. A support table for supporting a substrate in a lithographic apparatus, said support table comprising a supporting side having a plurality of support protrusions and a plurality of heat transfer protrusions, wherein the height of the support protrusions is slightly greater than the height of the heat transfer protrusions so as to create a heat exchanging gap between the heat transfer protrusions and the substrate when the substrate is supported by the support protrusions, wherein said supporting side and said support and heat transfer protrusions, together with the substrate, are arranged to substantially enclose a first space when the substrate is supported by the support protrusions, and wherein said heat exchanging gaps are part of said first space.

* * * * *